United States Patent [19]

Miyakawa et al.

[11] 4,404,648

[45] Sep. 13, 1983

[54] METHOD FOR CONTROLLING AN INSTRUMENT PANEL DISPLAY

[75] Inventors: Nobuaki Miyakawa; Masayuki Miki, both of Ibaraki, Japan

[73] Assignee: Hitachi, Ltd., Tokyo, Japan

[21] Appl. No.: 56,224

[22] Filed: Jul. 10, 1979

[30] Foreign Application Priority Data

Jul. 19, 1978 [JP] Japan .................................. 53-87060

[51] Int. Cl.³ ........................... G06F 9/46; G06F 3/14
[52] U.S. Cl. .................................... 364/900; 364/424; 364/565
[58] Field of Search ... 364/200 MS File, 900 MS File, 364/565, 556, 431, 424, 484; 235/92 NT, 92 FQ, 92 DP, 92 TF; 324/160, 166; 377/2, 17, 19

[56] References Cited

U.S. PATENT DOCUMENTS

| | | | |
|---|---|---|---|
| 3,286,239 | 11/1966 | Thompson et al. | 364/200 |
| 3,582,901 | 6/1971 | Cochrane et al. | 364/200 |
| 3,905,025 | 9/1975 | Davis et al. | 364/200 |
| 4,055,993 | 11/1977 | Rackliffe et al. | 235/92 FQ |
| 4,056,847 | 11/1977 | Marcantonio | 364/200 |
| 4,128,892 | 12/1978 | Vasa | 235/92 DP |
| 4,144,573 | 3/1979 | Trussell et al. | 364/565 |
| 4,151,403 | 4/1979 | Woolston | 235/92 DP |
| 4,158,885 | 6/1979 | Neuberger | 364/565 |
| 4,181,962 | 1/1980 | West, Jr. et al. | 235/92 FQ |
| 4,184,203 | 1/1980 | Skarvada | 364/565 |
| 4,197,585 | 4/1980 | Moorey et al. | 364/565 |

OTHER PUBLICATIONS

Callahan and Edel, "Masking Selected Interrupts from Selected Input/Output Devices", *IBM Tech. Discl.*, vol. 19, No. 8, Jan. 1977, pp. 2997-2998.

*Primary Examiner*—Eddie P. Chan
*Attorney, Agent, or Firm*—Antonelli, Terry & Wands

[57] ABSTRACT

In a system for displaying a plurality of parameters, such as on an instrument panel of a vehicle, a plurality of signals in the form of pulses each having a pulse frequency corresponding to a respective parameter are generated by respective sensors. Each pulse supplied from these signals to a status register results in generation of an interrupt request signal to a central processing unit. The central processing unit controls a mask register which in turn controls a gating arrangement which selectively masks or inhibits the application of pulses from one or more sensors to the status register so that upon receiving a first interrupt request signal, the central processing unit can mask all sensors but the one responsible for the interrupt request signal and proceed with calculation of the parameter associated therewith by measuring the interval between subsequently-generated interrupt request signals, such measurement being carried out by execution of increment instructions. Internal timing and the use of flags provides for the calculation of successive values of different parameters and the periodic display thereof.

6 Claims, 11 Drawing Figures

RAM

| ADDR 200 | i=0 | DATA |
|---|---|---|
| 201 | i=1 | DATA |
| 202 | i=2 | DATA |
| 203 | i=0 | S FLAG |
| 204 | i=1 | S FLAG |
| 205 | i=2 | S FLAG |
| 206 | i=0 | D FLAG |
| 207 | i=1 | D FLAG |
| 208 | i=2 | D FLAG |
| 209 | t0 | FLAG |
| 210 | t1 | FLAG |
| 211 | t2 | FLAG |

METHOD FOR CONTROLLING AN INSTRUMENT PANEL DISPLAY

FIELD OF THE INVENTION

This invention relates to a method for a control of a display, more specifically for a control of an instrument panel display for a vehicle.

A conventional instrument panel display comprises many independent circuits each of which detects each vehicle parameter such as engine speed or vehicle speed, and displaies such detected vehicle parameter. Each display for each vehicle parameter needs an exclusive circuit. Therefore, an increase of the number of parameters to be displayed brings an increase of the number of exclusive circuits required and complication of the total circuits of the instrument panel display. As a result the instrument panel display is expensive to manufacture.

SUMMARY OF THE INVENTION

An object of the invention is to provide a method for controlling a plurality of displays on a real-time basis with a simple circuit.

The method of the invention employing a digital computer to detect and calculate the value to be displayed comprises a first step for generating series pulses, the frequency of which is proportional to the displaying value, a second step for generating a pulse which indicates the time passage corresponding to preset digital data, a third step for generating an interrupt request in response to the output of the first or second step, a fourth step for detecting the period between the interrupt requests produced on the basis of the output of the first step, a fifth step for calculating data to be displayed on the basis of the data indicating the period being detected by the fourth step, and a sixth step for displaying the data being calculated by the fifth step in response to the interrupt request produced on the basis of the output of the second step.

The method of the present invention generates at least two kinds of interrupt requests, one of which responds to series pulses of the vehicle parameter to be displayed and is used for detecting the period of the series pulses, and other of which responds to the passage of time and is used for starting a display operation for displaying the vehicle parameter calculated in accordance with the detected period.

The system of the invention offers the possibility of a total system which detects a plurality of vehicle parameters and displays a plurality of such parameters. This invention may be better understood by reference to the detailed description which follows and to the drawings. This detailed description of the invention is of an embodiment of display system for displaying engine speed, vehicle speed and engine temperature, but it should be understood that the principles and approaches taken in connection with this particular type of display are applicable to other parameters as well.

DETAILED DESCRIPTION OF THE INVENTION

Figure 1:
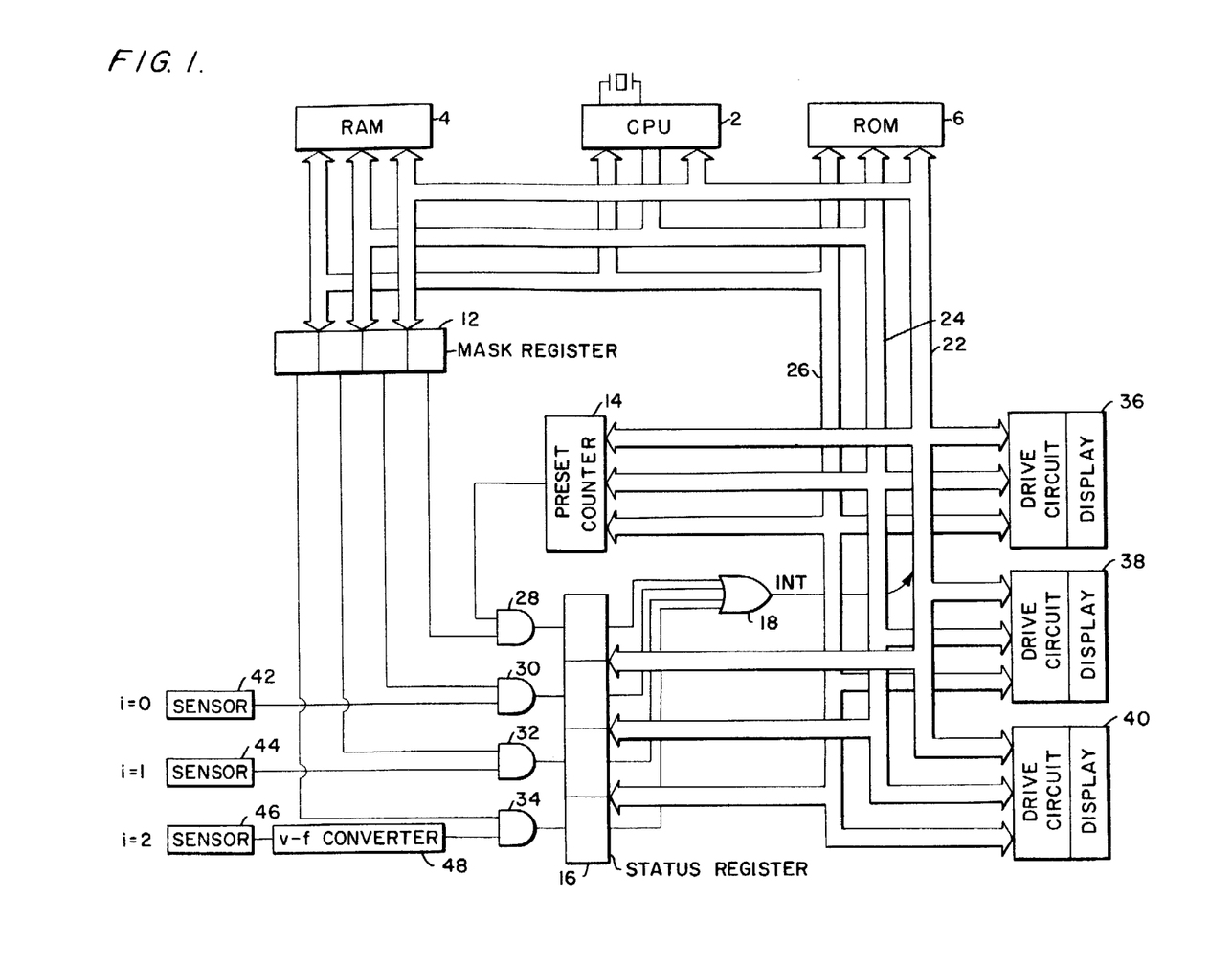
FIG. 1 is a schematic block diagram of an instrument panel display system for displaying engine speed, vehicle speed and engine temperature.

FIG. 1 is a block diagram of a display system comprising a central processing unit (CPU) 2, a random access memory (RAM) 4, a read only memory (ROM), a mask register 12, a presetable counter 14 being operated as a timer, a status register 16, an OR gate 18, AND gates 28 to 34, sensors 42 to 46, a voltage-frequency convertor 48, displays 36 to 40, a control bus, an address bus, and a data bus. The sensor 42 detects pulses which are generated in synchronization with an engine shaft rotation. The sensor 44 detects pulses which are generated in synchronization with a wheel speed of a vehicle. The sensor 46 detects temperature of an engine, and generates an output voltage in correspondence with the engine temperature. A v-f convertor generates pulses having a frequency which is proportional to the input voltage. Therefore, the combination of the sensor 46 and the v-f convertor generates serial pulses whose frequency is changed, in accordance with the temperature of the engine. The pulses delivered from sensors 42 and 44 as well as V-f convertor 48 are applied the respective stages of the status register 16 having 4 stages in all through the AND gates 30 to 34, respectively. An output pulse from the preset counter 14 is also applied to a stage of the status register through the AND gate 28.

The combination of the mask register 12 and AND gates 28 to 34 is used in this embodiment to stop the operation for setting into the status register 16 the pulses from all but one of the preset counter 14, the sensors 42 and 44 and the V-f convertor 48. When the status register 16 receives a pulse from one of the AND gates 28 to 34, an interrupt request is generated by the OR gate 18 to notify the CPU 2 of a request for service.

The preset counter receives 4-bit parallel data, and then downcounts such 4 bit parallel data in response to clock signals which are transferred from the CPU through the control bus 22. When the stored data in the preset counter 14 is zero, the output is applied to the status register 16 through the AND gate 28.

The status register 16, the preset counter 14 and the mask register 12 are connected to the CPU 2 through the control bus 22, address bus 24 and data bus 26. Engine speed data is calculated by CPU 2 in accordance with the output pulses from the sensor 42 and transferred to the display device 36. Vehicle speed data is calculated by CPU 2 in accordance with the output pulses from the sensor 44 and transferred to the display device 38. Engine temperature data is also calculated by CPU 2 in accordance with the output pulses from the V-f converter 48 and transferred to the display device 40.

Figure 2:
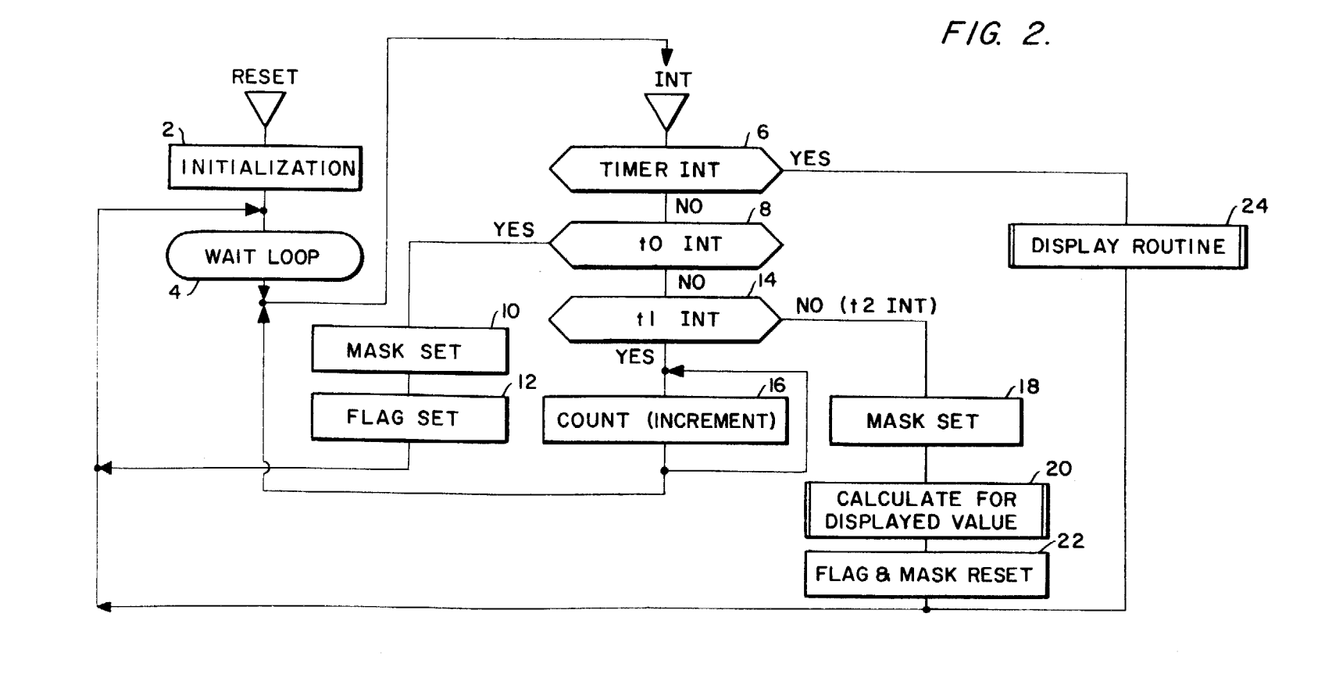
FIG. 2 is a flow diagram illustrative of the operation of the digital computer for detecting periods of series pulses, calculating the data to be displayed on the basis of the detecting periods and displaying the calculated data.
Figure 3:
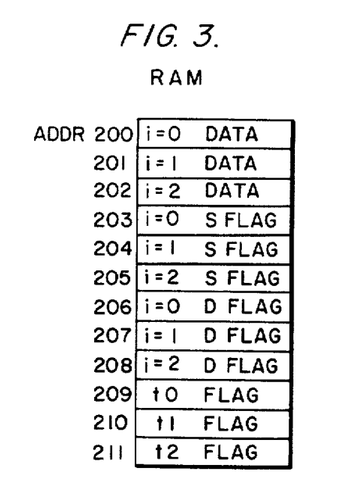
FIG. 3 is a stored information diagram for calculated data and flags used for the operation of the display system.

FIG. 2 shows these calculating and displaying operations. When a key switch of a vehicle is turned on, the CPU mode is shifted into the Reset mode and starts a step 2 for an initialization of the display system. At this step 2, each address of the RAM is cleared. Therefore, the data area comprising addresses 200 to 202 and the FLAG area comprising addresses 203 to 211 as shown in FIG. 3 are reset, and then the flag $t_o$ is set into the memory at address 209. Data "1111" is set into the mask register for enabling all of the AND gates 28 to 34. Therefore, it is possible to set a pulse into a stage of the status register when the preset counter, sensors 42 or the 44 or V-f converter 48 generates a pulse. A display period count T5 is also set into preset counter 14 which down-counts such T5 data in response to a clock signal transferred from the CPU and generates an output pulse when the T5 data becomes zero.

The operation of the CPU shifts to the next step 4 from the initialization step 2. At the step 4, the CPU 2 is waiting for an interrupt request to occur. If the interrupt request is generated by the status register 16, the operation of the CPU is jumped to a step 6 for testing the state of the status register 16.

Figure 4:
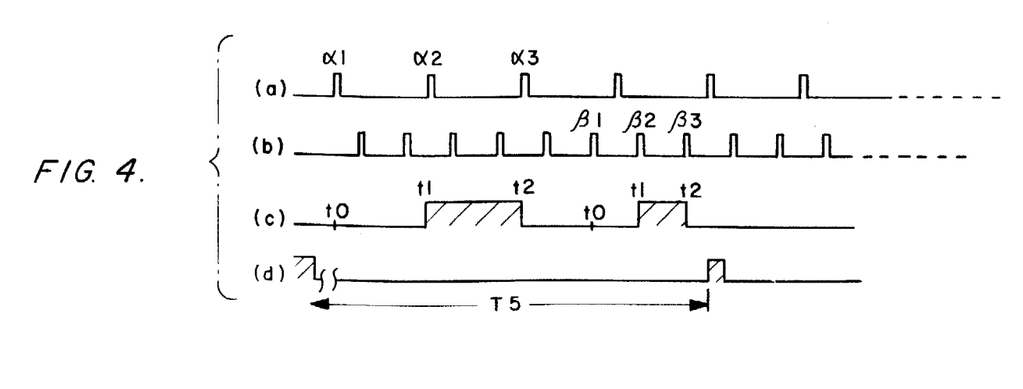
FIG. 4 is a timing diagram illustrative of the display system.

The operation of the interrupt of FIG. 2 is explained with timing chart shown in FIG. 4. FIG. 4(a) shows a series of pulses which are applied to the AND gate 30 from the sensor 42. FIG. 4(b) shows a series of pulses which are applied to the AND gate 32 from the sensor 44.

It is assumed that the pulse $\alpha1$ from the sensor 42 is applied to the status register 16 through the AND gate 30 and data being stored in the status register 16 is changed from a condition "0000" to "0100". An interrupt request is applied to the CPU from the OR gate 18 to notify the CPU of a request for service.

At the step 6, the data stored in the status register is loaded in the CPU through the data bus 26 for examining whether the reason for requesting interrupt is in accordance with the output of the preset counter 14. In this case, since the interrupt request is generated by the output of the sensor 42, the operation of the CPU is shifted to a step 8 where it is examined whether the generation of the interrupt is based on a first pulse from the sensor 42. Since at the initialization step 2 or step 22, the $t_0$ flag is set into the address 209 and the $t_1$ and $t_2$ flag in the addresses 210 and 211 are reset, the operation of the CPU is shifted to a step 10 by the $t_0$ flag in the address 209.

At the step 10, data "0100" is set into the mask register 12 for turning off the AND gates 28, 32 and 34, and for turning on the AND gate 30. At the step 12, the $t_0$ flag in the address 209 as shown in FIG. 3 is reset and the $t_1$ flag is set into the address 210. In this condition, the status register 16 is reset for receiving the next pulse from the sensor 42 through the AND gate 30. The CPU is shifted to the wait loop step for waiting for the generation of the next interrupt request in accordance with the next pulse $\alpha$ 2.

When the pulse $\alpha2$ is applied to the status register 16 through AND gate 30, the interrupt request is forwarded to the CPU through the OR gate 18 and the control bus 22. The operation of the CPU is shifted to the step 6, and the data being stored in the status register 16 is loaded into the CPU for examining the cause of the generation of the interrupt request. Since the interrupt request is not based on the preset counter output, the operation of the CPU is shifted to the step 8. Since the $t_0$ flag is not set in the address 209, the operation of the CPU is shifted to the step 14.

Since a $t_1$ flag is set in the address 210, the operation of the CPU is transferred to a step 16 of the counting routine for detecting the period between the pulse $\alpha2$ and the next pulse $\alpha3$. In this condition the status register 16 is reset for sensing the next pulse $\alpha3$. Since the stored data of mask register 12 remains, the AND gate 30 is turned on and the AND gates 28, 32 and 34 are turned off. Therefore, the output pulses from the sensors 44 and 46 and the preset counter 14 are stopped from delivering pulses through the AND gates 28, 32 and 34 to the status register 16. At the counting routine 16 the CPU executes an increment instruction until the next pulse $\alpha3$ is applied to the status register 16.

When the pulse $\alpha3$ is applied to the status register 16, the interrupt request signal is applied into the CPU through the control bus 22. In this case, since the $t_2$ flag is set in the address 211, the operation of the CPU is transferred to a step 18 through the steps 6, 8 and 14. At the step 18, data "0000" is set into the mask register for turning off all AND gates 28, 30, 32 and 34.

Figure 6:
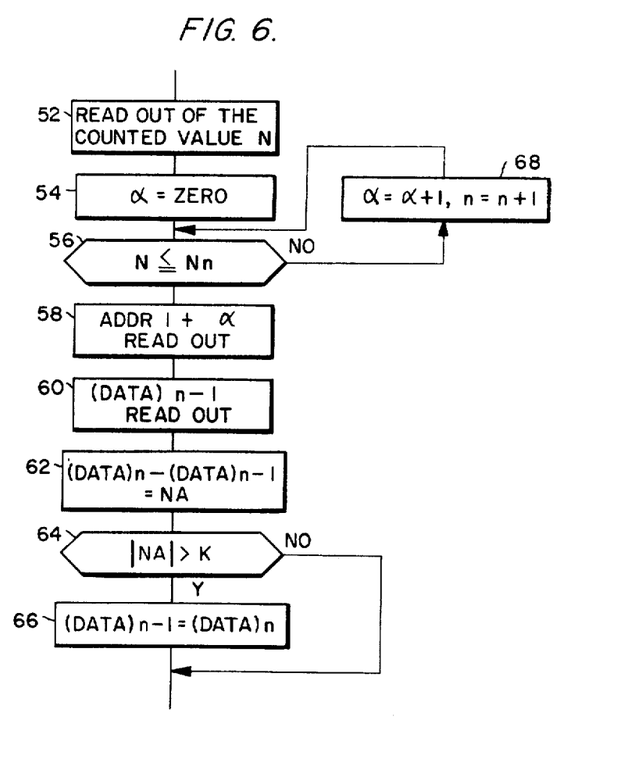
FIG. 6 is a detailed flow diagram of the calculating routine of FIGS. 2 and 5.

At the step 20, an engine speed to be displayed is calculated on the basis of the counted value indicating the period of the series of pulses. The calculating routine of the step 20 is shown in FIG. 6 in detail. The engine speed value being calculated in step 20 in stored in the memory at the address 201.

At the step 22, the $t_2$ flag is reset and the $t_0$ flag is set and data "1111" is set in to the mask register 12 for enabling all AND gates 28 to 34.

In reference to FIG. 4, the period between the pulse $\alpha2$ and $\alpha3$ is detected by the counting routine step 16. It is assumed that the operation of the CPU is returned to the wait-loop of the step 4 and then a pulse $\beta1$ is applied to the status register 16 through the AND gate 32 from the sensor 44. The interrupt request signal transfers the operation point of the CPU to the step 10 through the step 6 and step 8. At this step 10, data "0010" is set into the mask register 12 for receiving only $\beta2$ and $\beta3$, and the data being stored in the status register 16 is reset. At the step 12, the $t_0$ flag in the address 209 is reset and the $t_1$ flag is set into the address 210, and the operation of the CPU is jumped to the wait loop step 4. Generation of the pulse $\beta2$ causes the interrupt request and the operation of the CPU is shifted to the counting routine 16 through the steps 6, 8 and 14. The CPU continues execution of the counting instruction until the interrupt request is generated by the pulse $\beta3$.

When the interrupt request is generated by the pulse $\beta3$, the operating point of the CPU is transferred to the step 18. Then data "0000" is set to the mask register 12 for stopping the generation of the interrupt request. Vehicle speed is calculated at the step 20 on the basis of the counted value which corresponds to the period between the pulses $\beta2$ and $\beta3$. The calculated vehicle speed is stored into the memory at the address 201. At the step 22, the $t_2$ flag in the address 211 is reset and the $t_0$ flag is set into the memory at the address 209.

Although the case of using the sensors 42 and 44 is described above, the operation in the case of using the output pulses from the V-f converter is also the same as the above operation.

When the data T5 being preset into the preset counter 14 becomes zero due to downcounting in response to the clock from the CPU, the pulse is applied to the status register through the AND gate 28 and then the interrupt request signal is applied to the CPU through the OR gate 18. In this case the operating point of the CPU is shifted to a display routine step 24. And the operating point of the CPU is shifted to the wait loop by the end of execution of the display routine. The CPU repeats the above operation flow. Namely in reference to FIG. (4)C, the CPU executes the counting step 16 as shown in FIG. 2 during the period between the time points t1 and t2 for detecting the period between the pulses $\alpha 2$ and $\alpha 3$ or between the pulses $\beta 2$ and $\beta 3$. The CPU calculates the values to be displayed such as engine speed, vehicle speed and engine temperature. In FIG. 4, pulses representative of an engine temperature are not shown. In accordance with engine temperature pulses, the CPU detects the period between two such pulses in the same way and calculates the engine temperature on the basis of the period.

Referring to FIG. 3, the engine speed, the vehicle speed and the engine temperature which are calculated by the CPU at the calculating routine 20 as shown in FIG. 2 are stored in the memory at the addresses 200, 201 and 202, respectively.

Figure 5:
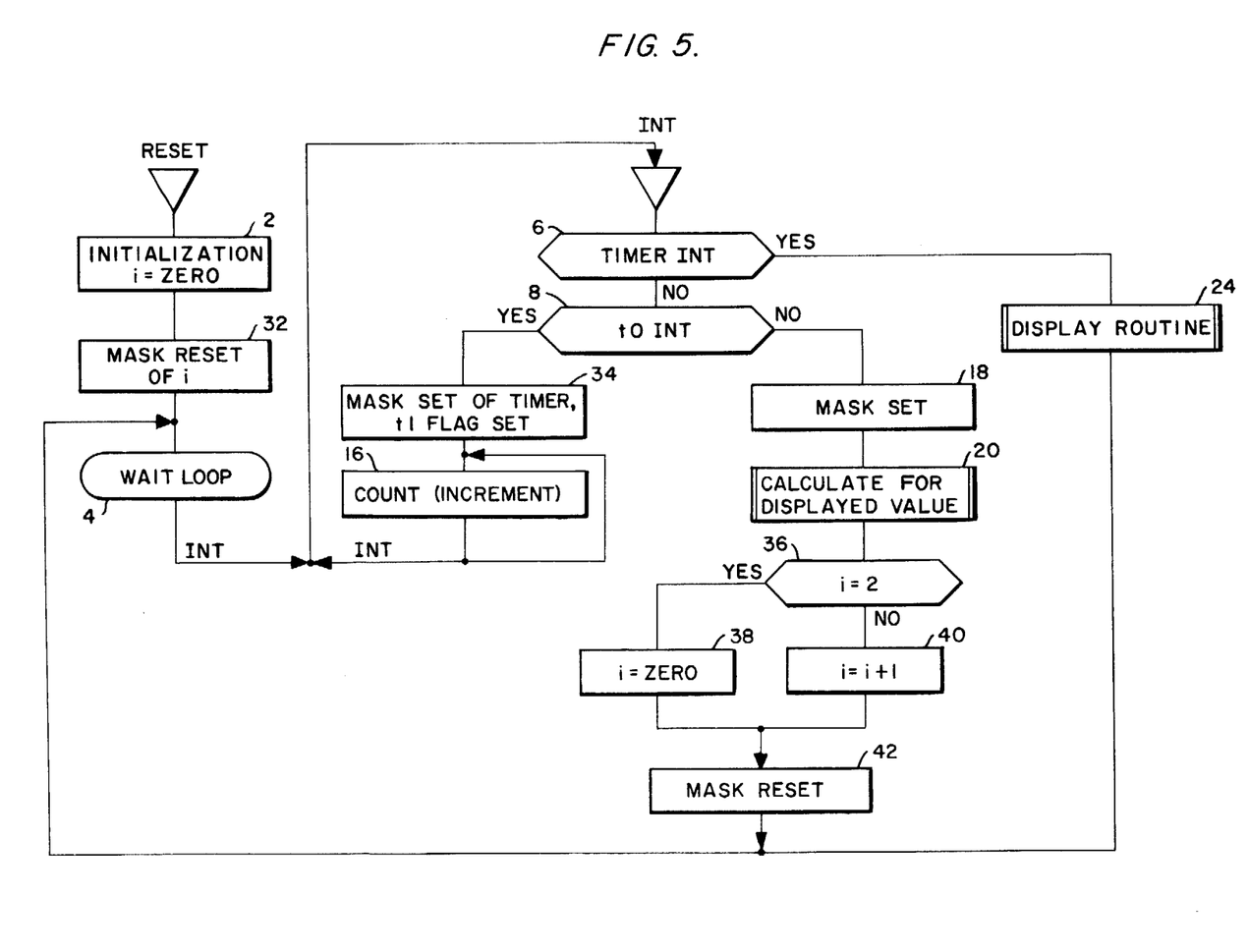
FIG. 5 is another embodiment of the display system.

Sensor flags being stored in the addresses 203 to 205 are not used for the flow of FIG. 2, but are used for the flow of FIG. 5 which is a flow chart showing another embodiment of the present invention.

Referring to FIG. 5 showing another embodiment of the present invention, when the key switch is turned on, the CPU is shifted into the reset mode and the operating point is transferred to step 2 which is almost the same as the step 2 in FIG. 2. At the step 2, the s flag and t0 flag are set in the addresses 203 and 209 respectively and the other addresses of the RAM are reset. At the next step 32, data 1100 is set in the mask register 12 for turning on the AND gates 28 and 30. Therefore, it is possible to set the outputs of the preset counter 14 and the sensor 42 into the status register, but it is impossible for the outputs of the sensor 44 and the V-f converter 48 to be set into the status register 16. At the waiting loop 4, the CPU is waiting to generate an interrupt request.

When the interrupt request is generated, the CPU examines whether such interrupt is based on the output of the preset counter 15 or the output of the sensor 42. If the interrupt is based on the output of the preset counter 14, the operating point is shifted to a display routine through the step 6. If the interrupt is based on the output of the sensor 42, the operating point of the CPU is transferred to the step 8.

It is assumed that the interrupt request is based on the output of the sensor 42. The operating point of the CPU is moved to the step 8 through the step 6. At the step 8, the CPU examines the t0 flag in the address 209. Since the t0 flag has been set, the execution of the CPU shifts to the step 34, and this step a data "0100" is set into the mask register 12 for turning off the AND gates 28, 32 and 34 but not the AND gate 30. In addition, the t0 flag in the address 209 is reset and the t1 flag is set in the address 210. At the step 16, the CPU begins the counting instruction for detecting the period between the output pulses of the sensor 42. When the interrupt request is generated by the OR gate 18, the CPU stops the execution of the step 16, and the executing step is transferred to the step 8 through the step 6. At the step 8, the CPU examines the t0 flag in the address 209. Because of the reset condition of the t0 flag and the set condition of the t1 flag, the executing step is shifted to the step 18 from the step 8. At the step 18, data "0000" is set into the mask register 12 for turning off all the AND gates 28, 30, 32 and 34.

At a calculating routine 20, the CPU calculates the engine speed in accordance with the counted value being executed by the step 16 and stores the calculated value at the address 200. At the step 36, the CPU examines the i=2 position of the s flag in the address 205.

Since the i=2 flag has been reset and the i=0 flag has been set, the executing step of the CPU is shifted to the step 40 where the i=0 flag is reset and the setting flag is changed to i=1 flag from the i=0 flag. Therefore the next execution of the FIG. 5 flowchart detects the period of the series of pulses from the sensor 44 and calculates the vehicle speed in accordance with such detected period. Then, the calculated value showing the vehicle speed is stored in the address 201. In this case, the set flag is changed to an i=2 flag from the i=1 flag by execution of the step 40.

If the i=2 s flag has been set in the address 205, the execution of the counting step 16 detects the period of the series pulses from the V-f converter 48 and the engine temperature is calculated and stored in the address 202 by the execution of the calculating routine 20. The execution step flows to step 38 from the step 20 through the step 36. At the step 38, the setting flag is changed to i=OS flag from the i=2 flag for detecting the period between the pulses of the sensor 42 and for calculating the engine speed. At the step 42, data is set into the mask register 12 in response to the value of "i".

If "i" is zero, data "1100" is set into the mask register 12 for turning on the AND gates 28 and 30. If "i" is 1, data "1010" is set into the mask register 12 for turning on the AND gates 28 and 32. If "i" is 2, data "1001" is set into the mask register 12 for turning on the AND gates 28 and 34.

If the CPU receives the interrupt request due to the output of the preset counter 14, the operating point of the CPU is transferred to the display routine 24 through the step 6.

Figure 7:
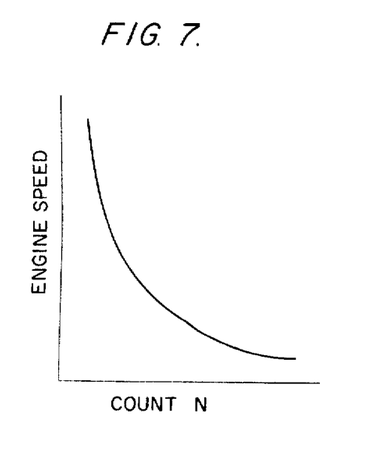
FIG. 7 is a graph illustrating the relation skip between counted data and an engine speed.
Figure 8:
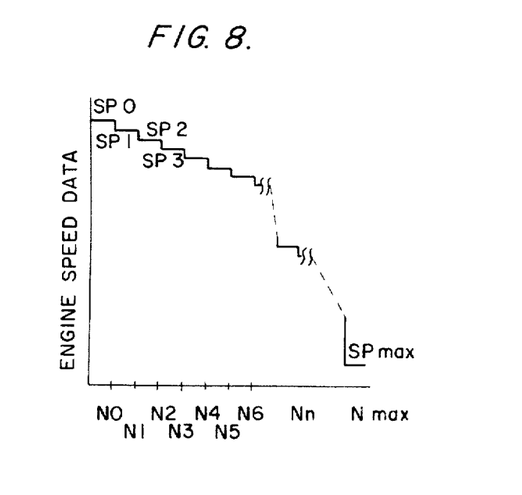
FIG. 8 is a graph linearizing the graph of FIG. 7.
Figure 9:
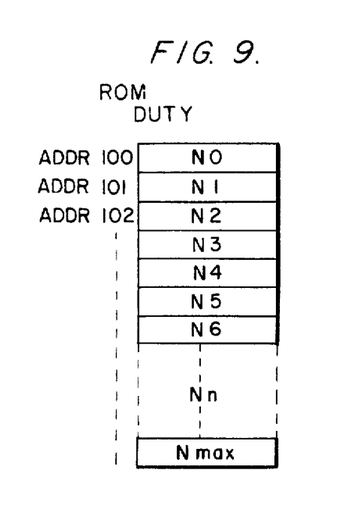
FIG. 9 is a stored information diagram illustrating the table of the counted value.
Figure 10:
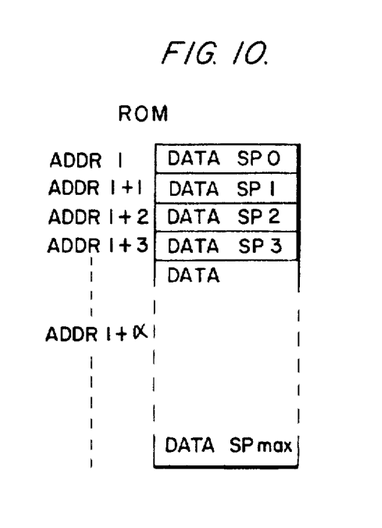
FIG. 10 is a stored information diagram illustrating the table of the data to be displayed.

The calculating routine 20 of FIG. 2 and FIG. 5 is shown in FIG. 6 in detail. Since the period of the pulses is inversely proportional to the engine or vehicle speed or the engine temperature, for example in the case of the engine speed, the relationship between the counted value and the engine speed is shown in FIG. 7. For reducing the executing time for calculating the engine speed on the basis of the counted value, a range of the counting value to be needed for calculating the display value is divided into many small ranges and each engine speed corresponding to each small range is memorized by the ROM 6. In order to keep the desired degree of accuracy, the part having a small counting value is divided into more ranges than the part having a large counting value. Therefore, the difference between the divided values N0 and N1 is smaller than the difference between the divided values N1 and N2. Namely, the difference between the divided values increases as the counted value is increased. As shown in FIG. 8, a change of the engine speed between the one divided range and the next divided range is almost the same. Such divided values N0, N1, ... Nmax are stored in the ROM as shown in FIG. 9 and the engine speed data SP0, SP1, SP2, ... SPmax which corresponds to divided values N0, N1, N2, ... Nmax is stored in the ROM as shown in FIG. 10.

As shown in FIG. 6, at a step 52 the counted value N is loaded into the CPU. At a step 54 "α" being used to detect an effective address is reset. At a step 56 the counted value N is compared with the stored divided value N0, and if the counted value N is not smaller than the stored divided value N0, the execution of the CPU is jumped to the step 68 where the "α" is increased (changed from zero to 1) and "n" is advanced by one step (changed from N0 to N1). The counted value N is compared with the stored divided value N1. The α and the n are advanced by one step until the counted value is smaller than or equal to the advanced divided value such as N0, N1, N2, N3, . . . Nmax and then the operating point of the CPU is shifted to step 58.

The CPU adds the counted α to a start address ADDR1 of the DATA SPO and loads data SP from the address ADDR+α. The loaded data SP is an engine speed corresponding to counted value N. Since such loaded data (SP)n is compared with the previous loaded data (SP)n−1, the previous loaded data (SP)n−1 is loaded from address 200 as shown FIG. 3 by step 60 and the difference between the new loaded value (SP)n and the previous value (SP)n−1 is calculated by step 62.

If the difference value |NA| is larger than the constant K, the previous value is changed to the new loaded value (SP)n by execution of the step 66. If the difference value |NA| is smaller than or equal to the constant K, the previous value remains in the address 200.

FIG. 6 is explained by way of an example of the engine speed, but the operation of the flow is the same as any other example such as vehicle speed and engine temperature.

Figure 11:
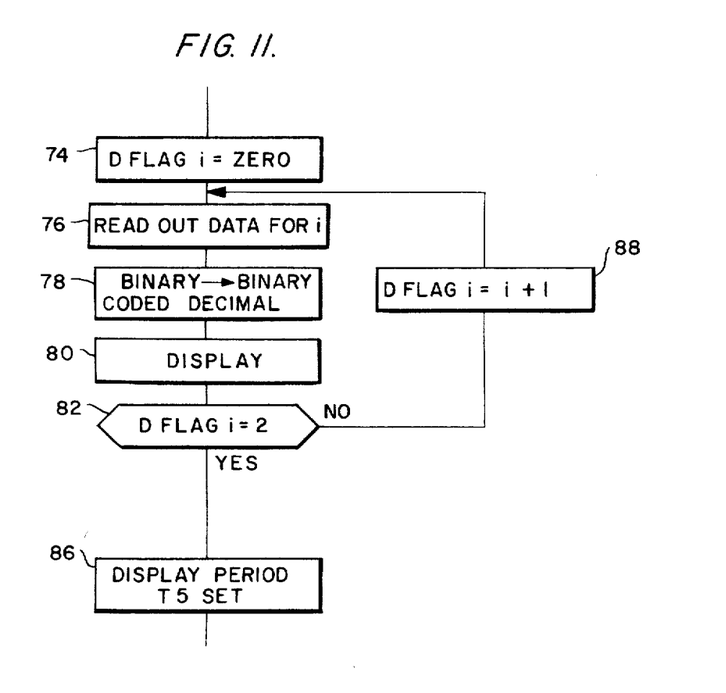
FIG. 11 is a detailed flow diagram of the display routine of FIGS. 2 and 5.

FIG. 11 is a detailed flow chart of the display routine 24 of FIGS. 2 and 5. A "D flag i" is reset to zero at the step 74. The "D flag i"=zero corresponds to the display device 36 for displaying the engine speed, the "D flag i"=1 corresponds to the display device 38 for displaying the vehicle speed and the "D flag i"=2 corresponds to display device 40 for displaying the engine temperature. At the step 76, since the "D flag" is zero, the engine speed is loaded from the address 200 as shown in FIG. 3 and the loaded data is changed to binary coded decimal data at the step 78. At the step 78, the display device 36 is selected in accordance with "D flag i"=1 by address data applied through the address bus 24 and the engine speed corresponding to the binary coded decimal data is displayed by the display device 36.

The "D flag i" is advanced by one step at a step 88 and the vehicle speed data is loaded from the address 201 of FIG. 3 by execution of the step 76. At the step 80, the display device 38 receives and displays the data which is changed to binary coded decimal data from the binary code data by execution of step 78. The "D flag i" is advanced to 2 by execution of the step 88 and then the engine temperature is displayed by display device 40. All data calculated by the flow of FIG. 6 is transferred to each of the display devices 36, 38 and 40. By the completion of the above operation the display cycle T5 is set into the preset counter 14, and then the operating point of the CPU is returned to the wait loop of FIG. 2 or 5.

What is claimed is:

1. A method for controlling a display system for displaying a plurality of calculated values including a plurality of sensing means for generating a plurality of signals each consisting of a series of pulses at a frequency proportional to a respective one of said values to be calculated and a plurality of display means each provided for display of a respective one of said calculated values, the method comprising
    (a) generating an initial interrupt request signal in response to receipt of a pulse from any one of said plurality of signals;
    (b) detecting which one of the sensing means has provided the pulse resulting in generation of said initial interrupt request signal;
    (c) masking the sensing means other than said one detected sensing means to prevent pulses from all but said one sensing means from generating interrupt request signals;
    (d) generating a second interrupt request signal in response to receipt of a second pulse from said one sensing means;
    (e) generating a third interrupt request signal in response to receipt of a third pulse from said one sensing means;
    (f) measuring the interval between said second and third interrupt request signals;
    (g) calculating a value based on said measured interval;
    (h) storing the value resulting from said calculating step;
    (i) removing the masking of said sensing means;
    (j) repeating the steps (a) through (g) and (i) to store other values relating to signals generated by the other sensing means;
    (k) counting a predetermined time interval in response to said initial interrupt request signal,
    (l) generating a final interrupt request signal at the end of said predetermined time interval; and
    (m) displaying said stored values in said respective display means in response to said final interrupt request signal.

2. A method for controlling a display system as claimed in claim 1, wherein said measuring step is performed by the execution of increment instructions by a central processing unit.

3. A display system for displaying a plurality of measured values comprising
    a plurality of sensing means for generating a plurality of signals each consisting of a series of pulses at a frequency proportional to a respective one of said values;
    a status register having a plurality of stages each individually settable by an applied pulse;
    gate means for selectively connecting the output signal of each sensing means to a respective stage of said status register;
    a mask register for controlling said gate means to selectively mask one or more output signals from said sensing means by preventing said signals from being applied to said status register;
    in rrupt request generating means for generating an interrupt request signal each time any one of the stages of said status register is set;
    central processing means responsive to interrupt request signals for controlling said mask register to control said gate means so that said interrupt request generating means receives pulses from only one sensing means during successive periods of time and for measuring the intervals between interrupt request signals from the one sensing means in each of the successive periods for calculating measured values to be displayed;

a plurality of display means responsive to said central processing means for displaying said calculated measured values; and counter means controlled by said central processing means for setting a stage of said status register at periodic intervals, said central processing means being responsive to an interrupt request signal generated as a result of said counter means for applying said calculated measured values to said display means.

4. A display system as claimed in claim 3, wherein said central processing means effects measurement of the intervals between interrupt request signals by execution of increment instructions.

5. A display system as claimed in claim 3, wherein said central processing means includes storage means for storing said calculated measured values and a plurality of flags and means for controlling the designation of the sensing means to be masked during said successive periods on the basis of said stored flags.

6. A display system as claimed in claim 3, wherein said display means each include a display device and a driver circuit for said display device, said calculated measured values being applied directly to said driver circuits from said central processing means.

* * * * *